(12) United States Patent
Choi et al.

(10) Patent No.: US 6,340,827 B1
(45) Date of Patent: Jan. 22, 2002

(54) DIFFUSION BARRIER FOR USE WITH HIGH DIELECTRIC CONSTANT MATERIALS AND ELECTRONIC DEVICES INCORPORATING SAME

(75) Inventors: Seungmoo Choi; Sailesh M. Merchant; Pradip K. Roy, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/478,647

(22) Filed: Jan. 6, 2000

Related U.S. Application Data

(60) Provisional application No. 60/115,783, filed on Jan. 13, 1999, and provisional application No. 60/115,841, filed on Jan. 13, 1999.

(51) Int. Cl.$^7$ ................................................ H01L 33/00
(52) U.S. Cl. ........................................ 257/310; 257/410
(58) Field of Search .................................. 257/310, 410

(56) References Cited

U.S. PATENT DOCUMENTS 5,912,486 A * 6/1999 Summerfelt
5,929,475 A * 7/1999 Uemoto et al.
5,942,799 A * 8/1999 Danek et al.
6,150,706 A * 11/2000 Thakur et al.

OTHER PUBLICATIONS

I. C. Kizilyalli, etal. "MOS Transistors with Stacked$SiO_2$–$Ta_2O_5$–$SiO_2$ Gate Dielectrics for Giga–Scale Integration of CMOS Technologies" IEEE Electron Device Letters, 19, (11), Nov. 1998 pp. 423–425.

P. K. Roy et al., "Stacked high–e gate dielectric for gigascale integration of metal–oxide–semiconductor technologies" Applied Physics Letters 72 (22) pp. 2835–2837, Jun. 1, 1998.

J.H. Stathis et al., "Reliability Projection for Ultra Thin Oxides at Low Voltage", 1998 IEDM Tech. Dig., pp. 167–170.

A. Chaterjee et al., "CMOS Metal Replacement Gate Transistors using Tantalum Pentoxide Gate Insulator" 1998 IEDM Tec. Dig., pp. 777–780.

* cited by examiner

Primary Examiner—Stephen D. Meier

(57) ABSTRACT

A diffusion barrier for preventing the diffusion of oxygen from a high dielectric constant material to a titanium nitride layer. The diffusion barrier comprises one or more layers, wherein each of the one or more layers comprises a material selected from the group consisting of metal carbide, metal nitride, metal boride, metal carbo-nitride, and silicon carbide. The high dielectric constant material may be tantalum pentoxide or any perkovskite-type high dielectric constant material.

51 Claims, 1 Drawing Sheet

DIFFUSION BARRIER FOR USE WITH HIGH DIELECTRIC CONSTANT MATERIALS AND ELECTRONIC DEVICES INCORPORATING SAME

RELATED APPLICATIONS

This application claims priority to U.S. Provisional Patent Application Nos. 60/115,783 and 60/115,841, both filed Jan. 13, 1999, which provisional applications are incorporated by reference herein.

BACKGROUND OF THE INVENTION

1. Field of the Invention

The present invention relates to diffusion barriers, and more particularly, to improved diffusion barriers for use with high dielectric constant materials.

2. Description of the Related Art

High dielectric constant materials ($\in_r >> \in_{SiO2} = 3.9 \in_0$) have been widely studied as a replacement for silicon dioxide ($SiO_2$) and silicon nitride ($Si_3N_4$) in silicon-based electronic devices, such as capacitors in dynamic random access memories (DRAMs), radio frequency (RF) circuits, metal-oxide-metal (MOM) capacitors, and metal-oxide-silicon (MOS) transistors. (See, e.g., P. K. Roy and I. C. Kizilyalli, "Stacked High-$\in$ Gate Dielectric for Gigascale Integration of Metal-Oxide-Semiconductor Technologies," Applied Physics Letters, Vol. 72, No. 22, pp. 2835–2837 (Jun. 1, 1988), and I. C. Kizilyalli, et al., "MOS Transistors with Stacked $SiO_2$—$Ta_2O_5$—$SiO_2$ Gate Dielectrics for Giga-Scale Integration of CMOS Technologies," IEEE Electron Device Letters, Vol. 19, No. 11, pp. 423–425 (November 1998), both of which are incorporated by reference herein).

In particular, tantalum pentoxide ($Ta_2O_5$) has been proposed as an alternative to $SiO_2$ with the advantage that it can be deposited by a low-temperature process (<500° C.). Generally, when manufacturing electronic devices incorporating $Ta_2O_5$, it may be advantageous to provide a titanium nitride (TiN) layer adjacent to the $Ta_2O_5$, for example, as a diffusion barrier or electrode, to form a $Ta_2O_5$/TiN structure. For example, a MOM capacitor could be formed from a layered stack of Al/TiN/$Ta_2O_5$/TiN/Ti. Likewise, a gate structure for an MOS transistor could be formed from a layered stack of Al/TiN/$Ta_2O_5$/SiO2/Si. It should be understood that many variations of the foregoing MOM capacitor and MOS transistor structures are well known in the art and the foregoing structures are meant to be illustrative and not limiting.

One problem associated with $Ta_2O_5$/TiN structures is that oxygen tends to migrate from the otherwise stable $Ta_2O_5$ and diffuse into the TiN during heat treatments, especially in cases where the TiN is Ti-rich. In the case of $Ta_2O_5$/TiN/Ti structures, such as in a MOM capacitor, the oxygen diffuses into the Ti. This diffusion of oxygen tends to reduce the $Ta_2O_5$ to elemental metal Ta. It has been found that this oxygen diffusion and reduction of $Ta_2O_5$ can occur at temperatures as low as 400–600° C. This can be a serious problem when manufacturing electronic devices incorporating $Ta_2O_5$/TiN and $Ta_2O_5$/TiN/Ti structures as the resulting devices will have high leakage currents or will otherwise be inadequate or, in extreme cases, inoperable.

SUMMARY OF THE INVENTION

Accordingly, the present invention is directed to a diffusion barrier that substantially obviates one or more of the problems due to limitations and disadvantages of the related art.

Additional features and advantages of the invention will be set forth in the description that follows and, in part, will be apparent from the description, or may be learned by practice of the invention. The objectives and other advantages of the invention will be realized and attained by the diffusion barrier and method particularly pointed out in the written description and claims hereof as well as the appended drawings.

To achieve these and other advantages and in accordance with the purposes of the invention, as embodied and broadly described, the invention provides an electronic device comprising a titanium nitride layer, a high dielectric constant material, and a diffusion barrier disposed between the titanium nitride layer and the high dielectric constant material to prevent the diffusion of oxygen from the high dielectric constant material to the titanium nitride layer.

To further achieve these and other advantages and in accordance with the purposes of the invention, as embodied and broadly described, the invention also provides a metal-oxide-metal capacitor comprising a first interconnect layer, a first titanium nitride layer adjacent to the first interconnect layer, a first diffusion barrier adjacent to the first titanium nitride layer, a tantalum pentoxide layer adjacent to the first diffusion barrier, a second diffusion barrier adjacent to the tantalum pentoxide layer, a second titanium nitride layer adjacent to the second diffusion barrier, and a second interconnect layer adjacent to the second titanium nitride layer, wherein the first diffusion barrier prevents the diffusion of oxygen from the tantalum pentoxide layer into the first titanium nitride layer and the first titanium layer, and wherein the second diffusion barrier prevents the diffusion of oxygen from the tantalum pentoxide layer into the second titanium nitride layer.

To still further achieve these and other advantages and in accordance with the purposes of the invention, as embodied and broadly described, the invention also provides a metal-oxide-semiconductor transistor having a gate structure, the gate structure comprising an interconnect layer, a titanium nitride layer adjacent to the interconnect layer, a diffusion barrier adjacent to the titanium nitride layer, a tantalum pentoxide layer adjacent to the diffusion barrier, and a gate insulator adjacent to the tantalum pentoxide layer, wherein the diffusion barrier prevents the diffusion of oxygen from the tantalum pentoxide layer into the titanium nitride layer.

To still even further achieve these and other advantages and in accordance with the purposes of the invention, as embodied and broadly described, the invention also provides a diffusion barrier for preventing the diffusion of oxygen from a high dielectric constant material to a titanium nitride layer, the diffusion barrier comprising one or more layers, wherein each of the one or more layers comprises a material selected from the group consisting of metal carbide, metal nitride, metal boride, metal carbo-nitride, and silicon carbide.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate several embodiments of the invention and, together with the written description, serve to explain the principles of the invention. In the drawings.

DESCRIPTION OF THE PREFERRED EMBODIMENTS

Reference will now be made in detail to the presently preferred embodiments of the invention, examples of which is illustrated in the accompanying drawings.

Figure 1:
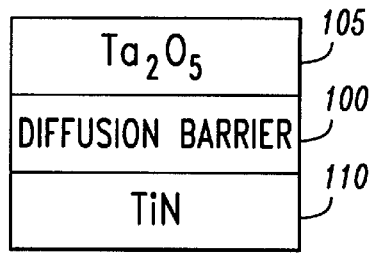
FIG. 1 is a cross-sectional view of a $Ta_2O_5$/diffusion barrier/TiN structure according to the present invention.

A diffusion barrier for use with a $Ta_2O_5$/TiN structure according to the present invention is shown in FIG. 1 and is designated generally by reference numeral 100. As embodied herein, the diffusion barrier 100 is disposed between a $Ta_2O_5$ layer 105 and a TiN layer 110 to prevent the diffusion of oxygen from the $Ta_2O_5$ layer 105 to the TiN layer 110 and, therefore, prevent the reduction of the $Ta_2O_5$ layer 105 to elemental metal Ta. In a preferred embodiment, the diffusion barrier 100 comprises one or more layers (in any combination), wherein each of the one or more layers comprises one of the following materials: metal carbide, metal nitride, metal boride, metal carbo-nitride, and silicon carbide. Thus, for example, the diffusion barrier 100 can comprise a single layer of metal carbide, a single layer of metal nitride, a single layer of metal boride, a single layer of metal carbo-nitride, or a single layer of silicon carbide. Alternatively, the diffusion barrier 100 can comprise two or more layers (in any combination), wherein each of the two or more layers is a single layer of metal carbide, a single layer of metal nitride, a single layer of metal boride, a single layer of metal carbo-nitride, or a single layer of silicon carbide.

It should be understand that the metal carbide can be any metal carbide, including but not limited to titanium carbide, tantalum carbide, zirconium carbide, molybdenum carbide, tungsten carbide, and chromium carbide. Further, it should be understood that the metal nitride can be any metal nitride, including but not limited to aluminum nitride, tungsten nitride, molybdenum nitride, zirconium nitride, and vanadium nitride. Still further, it should be understood that the metal boride can be any metal boride, including but not limited to titanium boride and zirconium boride. Preferably, any refractory metal can be used as the metal in each of the metal carbide, metal nitride, and metal boride.

Preferably, each layer of the diffusion barrier 100 has a thickness of about 10–50 Å. However, A thickness of about 10–200 Å, 50-1000 Å, or 200–300 Å is also acceptable. Further, the diffusion barrier 100 can be formed by any technique known to those skilled in the art, include physical and/or chemical vapor deposition. For example, in the case of sputtering nitrides, deposition of the diffusion barrier materials is preferably performed in a nitrogen-containing atmosphere. As another example, in the case of depositing tungsten nitride by chemical vapor deposition, deposition can be performed using tungsten carbonyl or tungsten hexoflouride as a precursor material.

It should be noted that use of metal carbide, metal nitride, metal boride, metal carbo-nitride, and/or silicon carbide as the diffusion barrier 100 material(s) has certain advantages over the use of other materials in terms of both the quality of the interfaces between the materials and the adjacent TiN layer 110 and, in the case of a multi-layer diffusion barrier 100, the quality of the interfaces between each of the layers that make up the diffusion barrier 100. For example, in the case of metal carbide, metal nitride, and metal boride, each has a cubic structure and therefore provides a low lattice misfit interface with the TiN layer 110, which also has a cubic structure (i.e., the diffusion barrier/TiN interface is substantially coherent). Furthermore, in the case of a metal carbide, metal nitride, and/or metal boride multi-layer diffusion barrier 100, the interface(s) between the multiple layers are also substantially coherent, again because each of the layers has a cubic structure.

EXAMPLE 1

Figure 2:
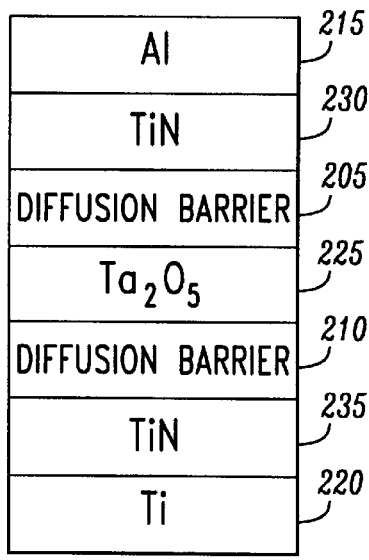
FIG. 2 is a cross-sectional view of an MOM capacitor according to the present invention.

FIG. 2 illustrates an example of a MOM capacitor 200 including the diffusion barrier according to the present invention. As shown in FIG. 5, the MOM capacitor comprises a layered stack of Al/TiN/diffusion barrier/$Ta_2O_5$/diffusion barrier/TiN/Ti. In the MOM capacitor 200, the diffusion barrier 205 prevents the diffusion of oxygen from the $Ta_2O_5$ layer 225 into the TiN layer 230, while the diffusion barrier 210 prevents the diffusion of oxygen from the $Ta_2O_5$ layer 225 into the TiN layer 235 and the Ti layer 220. Again, the diffusion barriers 205 and 210 can have any of the configurations described above with regard to the diffusion barrier 100. Further, the diffusion barriers 205 and 210 need not have the same configurations. Still further, the Ti layer 220 and the Al layer 215, which serve as interconnect layers, can be replaced with other materials known to those skilled in the art for performing their respective functions. For example, the Ti layer 220 can be replaced with a tantalum or tantalum nitride layer, and the Al layer 215 can be replaced with a copper layer.

EXAMPLE 2

Figure 3:
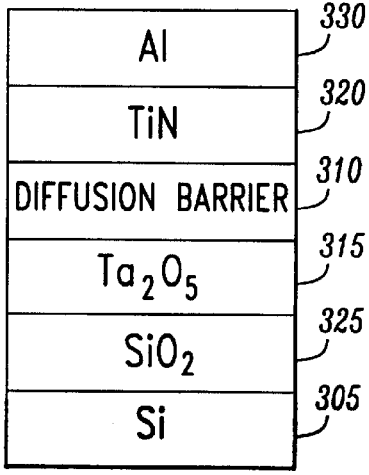
FIG. 3 is a cross-sectional view of an MOS transistor gate structure according to the present invention.

FIG. 3 illustrates an example of an MOS transistor gate structure 300 including the diffusion barrier according to the present invention. As shown in FIG. 6, the gate structure 300 comprises a layered stack (provided on a silicon substrate 305) of $SiO_2$/$Ta_2O_5$/diffusion barrier/TiN/Al. In the gate structure 300, the diffusion barrier 310 prevents the diffusion of oxygen from the $Ta_2O_5$ layer 315 into the TiN layer 320. As in Example 1, the diffusion barrier 310 can have any of the configurations described above with regard to the diffusion barrier 100. Further, the $SiO_2$ layer 325 and the Al layer 330, which serve as a gate insulator and interconnect layer, respectively, can be replaced with other materials known to those skilled in the art for performing their respective functions. For example, the $SiO_2$ layer 325 can be replaced by a $Ta_2O_5$ layer or a combination of a $Ta_2O_5$ layer and an $SiO_2$ layer. Alternatively, the $Ta_2O_5$ layer 315 itself can serve as the gate insulator in which case the $SiO_2$ layer 325 would not be present.

It will be apparent to those skilled in the art that various modifications and variations can be made to the present invention without departing from the spirit or scope of the invention. For example, although the diffusion barrier according to the present invention has been described for use with a $Ta_2O_5$/TiN structure, it is also useful as a diffusion barrier for a Ta2O5/TiN/Ti structure, as well as an X/TiN structure and an X/TiN/Ti structure, where X is any perkovskite-type high dielectric constant material, including but not limited to barium-based oxides, strontium-based oxides, lanthanum-based oxides, zirconium-based oxides, titanates of each of the foregoing oxides, and a combination of two or more of the foregoing. Thus, it is intended that the present invention covers the modifications and variations of this invention provided they come within the scope of the appended claims and their equivalents.

What is claimed is:

1. An electronic device comprising:
   a titanium nitride layer;
   a high dielectric constant material; and
   a diffusion barrier disposed between the titanium nitride layer and the high dielectric constant material, the diffusion barrier being configured to prevent a diffusion of oxygen from the high dielectric constant material.

2. The electronic device of claim 1, wherein the high dielectric constant material is tantalum pentoxide.

3. The electronic device of claim 1, wherein the high dielectric constant material is a perkovskite-type high dielectric constant material.

4. The electronic device of claim 3, wherein the perkovskite-type high dielectric constant material is a barium-based oxide, a strontium-based oxide, a lanthanum-based oxide, a zirconium-based oxide, a titanate of one of the foregoing oxides, or a combination of two or more of the foregoing.

5. The electronic device of claim 1, wherein the diffusion barrier comprises one or more layers and wherein each of the layers comprises one or more of the following materials: metal carbide, metal nitride, metal boride, metal carbo-nitride, and silicon carbide.

6. The electronic device of claim 5, wherein the metal carbide is selected from the group consisting of titanium carbide, tantalum carbide, zirconium carbide, molybdenum carbide, tungsten carbide, and chromium carbide.

7. The electronic device of claim 5, wherein the metal nitride is selected from the group consisting of aluminum nitride, tungsten nitride, molybdenum nitride, zirconium nitride, and vanadium nitride.

8. The electronic device of claim 5, wherein the metal boride is selected from the group consisting of titanium boride and zirconium boride.

9. The electronic device of claim 5, wherein the metal in one or more of the metal carbide, the metal nitride, and the metal boride is a refractory metal.

10. The electronic device of claim 5, wherein each of the one or more layers has a thickness of about 10–50 Å.

11. The electronic device of claim 5, wherein each of the one or more layers has a thickness of about 10–200 Å.

12. The electronic device of claim 5, wherein each of the one or more layers has a thickness of about 50–1000 Å.

13. The electronic device of claim 5, wherein each of the one or more layers has a thickness of about 200–300 Å.

14. The electronic device of claim 1, further comprising a titanium layer adjacent to the titanium nitride layer and opposite the diffusion barrier, wherein the diffusion barrier further prevents the diffusion of oxygen from the high dielectric constant material to the titanium layer.

15. The electronic device of claim 1, wherein the electronic device is a DRAM, a radio frequency circuit, a metal-oxide-metal capacitor, or a metal-oxide-silicon transistor.

16. A metal-oxide-metal capacitor comprising:
    a first interconnect layer;
    a first titanium nitride layer adjacent to the first interconnect layer;
    a first diffusion barrier adjacent to the first titanium nitride layer;
    a tantalum pentoxide layer adjacent to the first diffusion barrier;
    a second diffusion barrier adjacent to the tantalum pentoxide layer;
    a second titanium nitride layer adjacent to the second diffusion barrier; and
    a second interconnect layer adjacent to the second titanium nitride layer, wherein the first diffusion barrier comprises one or more layers and each of the one or more layers comprises a metal carbide, a metal boride, a metal carbo-nitride, or silicon carbide and wherein the second diffusion barrier comprises one or more layers and each of the one or more layers comprises a metal carbide, a metal boride, a metal carbo-nitride, or silicon carbide.

17. The metal-oxide-metal capacitor of claim 16, wherein the metal carbide is selected from the group consisting of titanium carbide, tantalum carbide, zirconium carbide, molybdenum carbide, tungsten carbide, and chromium carbide.

18. The metal-oxide metal capacitor of claim 16, wherein the metal boride is selected from the group consisting of titanium boride and zirconium boride.

19. The metal-oxide metal capacitor of claim 16, wherein the metal in one or more of the metal carbide and the metal boride is a refractory metal.

20. The metal-oxide metal capacitor of claim 16, wherein each of the one or more layers has a thickness of about 10–50 Å.

21. The metal-oxide metal capacitor of claim 16, wherein each of the one or more layers has a thickness of about 10–200 Å.

22. The metal-oxide-metal capacitor of claim 16, wherein each of the one or more layers has a thickness of about 50–1000 Å.

23. The metal-oxide-metal capacitor of claim 16, wherein each of the one or more layers has a thickness of about 200–300 Å.

24. The metal-oxide-metal capacitor of claim 16, wherein the first interconnect layer comprises titanium, tantalum, or tantalum nitride.

25. The metal-oxide-metal capacitor of claim 16, wherein the second interconnect layer comprises aluminum or copper.

26. A metal-oxide-semiconductor transistor having a gate structure, the gate structure comprising:
    an interconnect layer;
    a titanium nitride layer adjacent to the interconnect layer;
    a diffusion barrier adjacent to the titanium nitride layer;
    a tantalum pentoxide layer adjacent to the diffusion barrier; and
    a gate insulator adjacent the tantalum pentoxide layer, wherein the diffusion barrier is configured to prevent a diffusion of oxygen from the tantalum pentoxide layer.

27. The metal-oxide-semiconductor transistor of claim 26, wherein the diffusion barrier comprises one or more layers and wherein each of the layers comprises one or more of the following materials: metal carbide, metal nitride, metal boride, metal carbo-nitride, and silicon carbide.

28. The metal-oxide-semiconductor transistor of claim 27, wherein the metal carbide is selected from the group consisting of titanium carbide, tantalum carbide, zirconium carbide, molybdenum carbide, tungsten carbide, and chromium carbide.

29. The metal-oxide-semiconductor transistor of claim 27, wherein the metal nitride is selected from the group consisting of aluminum nitride, tungsten nitride, molybdenum nitride, zirconium nitride, and vanadium nitride.

30. The metal-oxide-semiconductor transistor of claim 27, wherein the metal boride is selected from the group consisting of titanium boride and zirconium boride.

31. The metal-oxide-semiconductor transistor of claim 27, wherein the metal in one or more of the metal carbide, the metal nitride, and the metal boride is a refractory metal.

32. The metal-oxide-semiconductor transistor of claim 27, wherein each of the one or more layers has a thickness of about 10–50 Å.

33. The metal-oxide-semiconductor transistor of claim 27, wherein each of the one or more layers has a thickness of about 10–200 Å.

34. The metal-oxide-semiconductor transistor of claim 27, wherein each of the one or more layers has a thickness of about 50–1000 Å.

35. The metal-oxide-semiconductor transistor of claim 27, wherein each of the one or more layers has a thickness of about 200–300 Å.

36. The metal-oxide-semiconductor transistor of claim 26, wherein the interconnect layer comprises aluminum.

37. The metal-oxide-semiconductor transistor of claim 26, wherein the gate insulator comprises silicon dioxide, tantalum pentoxide, or a combination of tantalum pentoxide and silicon dioxide.

38. The metal-oxide-semiconductor transistor of claim 26, wherein the tantalum pentoxide layer serves as the gate insulator.

39. A diffusion barrier for preventing the diffusion of oxygen from a high dielectric constant material to a titanium nitride layer, the diffusion barrier comprising:

one or more layers, wherein each of the one or more layers comprises a material selected from the group consisting of metal carbide, metal boride, metal carbo-nitride, and silicon carbide.

40. The diffusion barrier of claim 39, wherein the high dielectric constant material is tantalum pentoxide.

41. The diffusion barrier of claim 39, wherein the high dielectric constant material is a perkovskite-type high dielectric constant material.

42. The diffusion barrier of claim 41, wherein the perkovskite-type high dielectric constant material is a barium-based oxide, a strontium-based oxide, a lanthanum-based oxide, a zirconium-based oxide, a titanate of one of the foregoing oxides, or a combination of two or more of the foregoing.

43. The diffusion barrier of claim 39, wherein the metal carbide is selected from the group consisting of titanium carbide, tantalum carbide, zirconium carbide, molybdenum carbide, tungsten carbide, and chromium carbide.

44. The diffusion barrier of claim 39, wherein the metal nitride is selected from the group consisting of aluminum nitride, molybdenum nitride, zirconium nitride, and vanadium nitride.

45. The diffusion barrier of claim 39, wherein the metal boride is selected from the group consisting of titanium boride and zirconium boride.

46. The diffusion barrier of claim 39, wherein the metal in one or more of the metal carbide and the metal boride is a refractory metal.

47. The diffusion barrier of claim 39, wherein each of the one or more layers has a thickness of about 10–50 Å.

48. The diffusion barrier of claim 39, wherein each of the one or more layers has a thickness of about 10–200 Å.

49. The diffusion barrier of claim 39, wherein each of the one or more layers has a thickness of about 50–1000 Å.

50. The diffusion barrier of claim 39, wherein each of the one or more layers has a thickness of about 200–300 Å.

51. The diffusion barrier of claim 39, wherein the diffusion barrier is formed by a physical or chemical vapor deposition.

* * * * *